United States Patent [19]
Kondo

[11] Patent Number: 5,521,415
[45] Date of Patent: May 28, 1996

[54] SEMICONDUCTOR DEVICE HAVING A CIRCUIT FOR PROTECTING THE DEVICE FROM ELECTROSTATIC DISCHARGE

[75] Inventor: Yasuo Kondo, Tokyo, Japan

[73] Assignee: NEC Corporation, Japan

[21] Appl. No.: 361,134

[22] Filed: Dec. 21, 1994

[30] Foreign Application Priority Data

Dec. 24, 1993 [JP] Japan .................................. 5-327134

[51] Int. Cl.$^6$ .............................. H01L 23/62; H02H 9/00
[52] U.S. Cl. ...................... 257/357; 257/355; 257/356; 257/360; 257/362; 361/56
[58] Field of Search ................................. 257/355, 356, 257/357, 360, 362, 659; 361/56

[56] References Cited

U.S. PATENT DOCUMENTS

| | | |
|---|---|---|
| 4,342,045 | 7/1982 | Kim .......................................... 357/41 |
| 4,811,155 | 2/1989 | Kuriyama et al. ........................ 361/56 |
| 4,987,465 | 1/1991 | Longcor et al. ......................... 257/357 |

FOREIGN PATENT DOCUMENTS

| | | | |
|---|---|---|---|
| 61-115344 | 6/1986 | Japan .................................... 257/355 |
| 2-28362 | 1/1990 | Japan .................................... 257/360 |
| 2-192760 | 7/1990 | Japan .................................... 257/357 |
| 4-65867 | 3/1992 | Japan .................................... 257/355 |
| 6-85176 | 3/1994 | Japan .................................... 257/360 |

OTHER PUBLICATIONS

"Latent Effects Due to ESD in CMOS Integrated Circuits: Review and Experiments"; Greason et al; IEEE Transactions on Industry Applications: Jan./Feb. 1993; Nov. 1.

Primary Examiner—Steven H. Loke
Attorney, Agent, or Firm—Hayes, Soloway, Hennessey, Grossman & Hage

[57] ABSTRACT

A semiconductor device is disclosed which has an input terminal, an input protective device, a first stage circuit connected between the input terminal and an internal circuit, and a ground line system including a plurality of ground lines divided for noise suppression. Ground nodes of the protective circuit and the first stage circuit are connected with each other and to a common first ground line, while the ground nodes of the internal circuit are connected to second and third ground lines. The parasitic resistance formed between the ground nodes for the protective device and for the first stage circuit is reduced, thereby providing a surge voltage not higher than a clamp voltage of the protective device to protect the first stage circuit against electrostatic discharge-induced failure.

9 Claims, 6 Drawing Sheets

SEMICONDUCTOR DEVICE HAVING A CIRCUIT FOR PROTECTING THE DEVICE FROM ELECTROSTATIC DISCHARGE

BACKGROUND OF THE INVENTION (a) Field of the Invention

The present invention relates to a semiconductor device and, more particularly, to a semiconductor device having a protective circuit for protecting the semiconductor device against an electrostatic discharge (ESD)-induced destruction.

(b) Description of the Related Art

A recent increase in integration densities and a recent lowering of operation voltages in integrated circuits generate more various noises on a power supply line ($V_{cc}$) and a ground line (GND) resulting in a trend for reduced noise margins.

To avoid erroneous operations resulting from such noises, the $V_{cc}$ line and the GND line of a VLSI are divided parallel in a layout from a circuit purpose point of view. For instance, to a protective circuit which drains a large amount of current into a ground line, an exclusive ground line is provided separately from a common ground line used for other functional circuits, thereby preventing the functional circuits from operating erroneously by supressing ground bounce phenomena.

Furthermore, an internal circuit expected to exhibit an especially accurate operation such as a sense amplifier is provided with a separate ground line for an exclusive use therefor. Accordingly, semiconductor devices generally have a plurality of separate parallel ground lines.

FIG. 1 is an equivalent circuit diagram of a conventional semiconductor device and its peripheral circuits illustrating therein an input protective circuit 3. The protective circuit 3 clamps the potential of an input terminal 1 to a clamp voltage relative to the potential of a ground line system including first through third ground lines GND1–GND3. In FIG. 1, functional circuits in the semiconductor device, i.e., circuits other than the protective circuit 3 are divided into a first stage circuit 4 for receiving an output from the protective circuit 3 and an internal circuit 5 for receiving an output from the first stage circuit 4. As an example of the first stage circuit 4, a CMOS inverter is illustrated in the drawing.

The first stage circuit 4 functions as an input circuit for the internal circuit 5 in the semiconductor device. As a result of the configuration, the potential of the input terminal 1 is clamped by the input protective circuit 3 when an excessively high voltage is applied to the input terminal 1, so that a surge current flows through a node A and then to a GND terminal 2 via a first ground line GND1. Accordingly, a voltage greater than the clamp voltage is not applied to the first stage circuit 4. Meanwhile, since the parallel ground line system includes the first ground line GND1 for the input protective circuit 3, the second ground line GND2 for the first stage circuit 4 and the third ground line GND3 for the internal circuit 5 separately formed, some interconnection resistances 6 due to their line lengths exist therebetween, whereby propagation of noise is reduced among the circuits 3, 4 and 5.

FIG. 2 is an equivalent circuit diagram showing a second conventional semiconductor device illustrating therein an input protective circuit 3, which clamps an input voltage to a clamp voltage relative to a ground line potential, and its peripheral circuits similarly to the first prior art. Although the input protective circuit 3 operates in a manner similar to that of the semiconductor device of FIG. 1, it provides a problem in its noise-resistive performance because the ground line system is not separated.

SUMMARY OF THE INVENTION

It is an object of the present invention to provide a semiconductor device having a protective circuit for protecting functional circuits against destruction by suppressing an excessively high surge voltage having a fast rise time such as defined by the Charged Device Model (CDM).

A semiconductor device according to the present invention comprises a plurality of ground lines including a first ground line and a second ground line, an input terminal for receiving a first signal from outside the semiconductor device, a protective device, having a current path including a first end connected to the input terminal and a second end connected to the first ground line, for draining a surge current along the current path from the input terminal to the first ground line, a first stage circuit, having a first ground node connected to at least one of the second end and the first ground line, for receiving the first signal from the input terminal to generate a second signal, and an internal circuit, having a second ground node connected to the second ground line, for receiving the second signal from the first stage circuit.

BRIEF DESCRIPTION OF THE DRAWINGS

The above and other objects, features and advantages of the present invention will be more apparent from the following description, taking in conjunction with accompanying drawings in which.

DESCRIPTION OF PREFERRED EMBODIMENTS

Before describing preferred embodiments of the present invention, problems and disadvantages involved in the conventional semiconductor devices will be described for a better understanding of the present invention.

Figure 1:
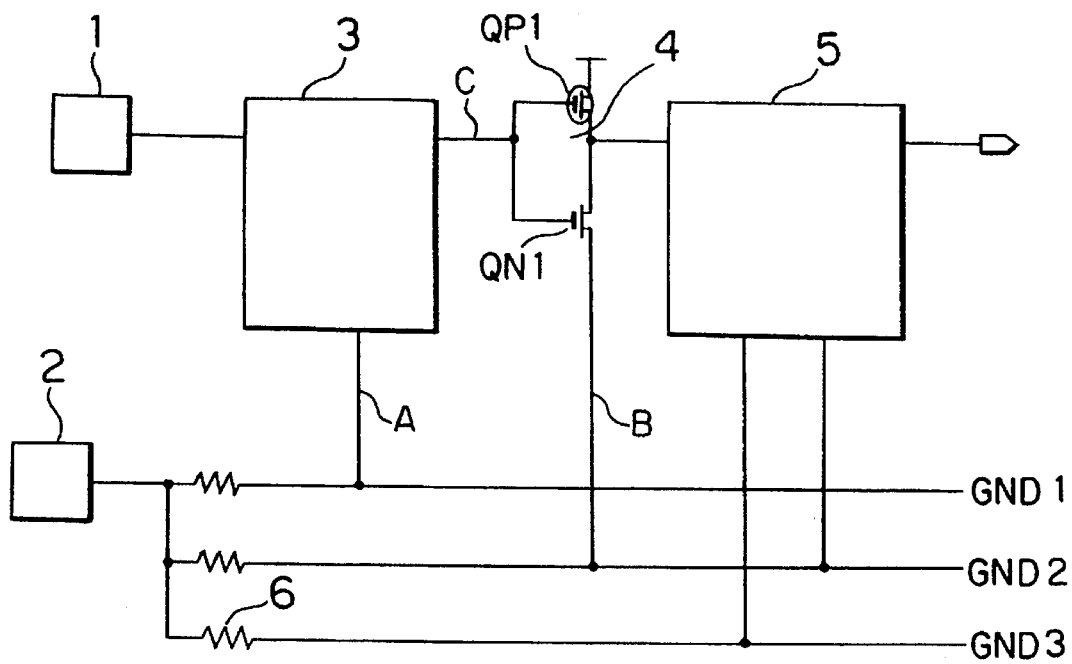
FIG. 1 is a circuit diagram of a conventional semiconductor device.

When an excessively high voltage which quickly rises such as an ESD signal defined in the CDM is applied to an input terminal 1 in FIG. 1, an instantaneous current of more than 10 A flows through the input protective circuit 3 into the ground line GND1. The resistivity of an aluminum interconnection constituting the ground line such as formed in DRAMs having a capacity of 4M to 16M bits is estimated at about a few tens mΩ/angstrom. Accordingly, the layout of the ground line system including a plurality of ground lines each allocated to corresponding one of circuits having a different functions such as shown in FIG. 1 induces a resistance of a few ohms existing between each of the ground lines. Hence, immediately after an excessively high voltage enters through the input terminal 1, the potential at node A constituting an output end of the ground line GND1 for the protective circuit 3 rises to a potential few tens of volts-higher than the potential at node B constituting an output end of the ground lines GND2 and GND3.

Figure 3:
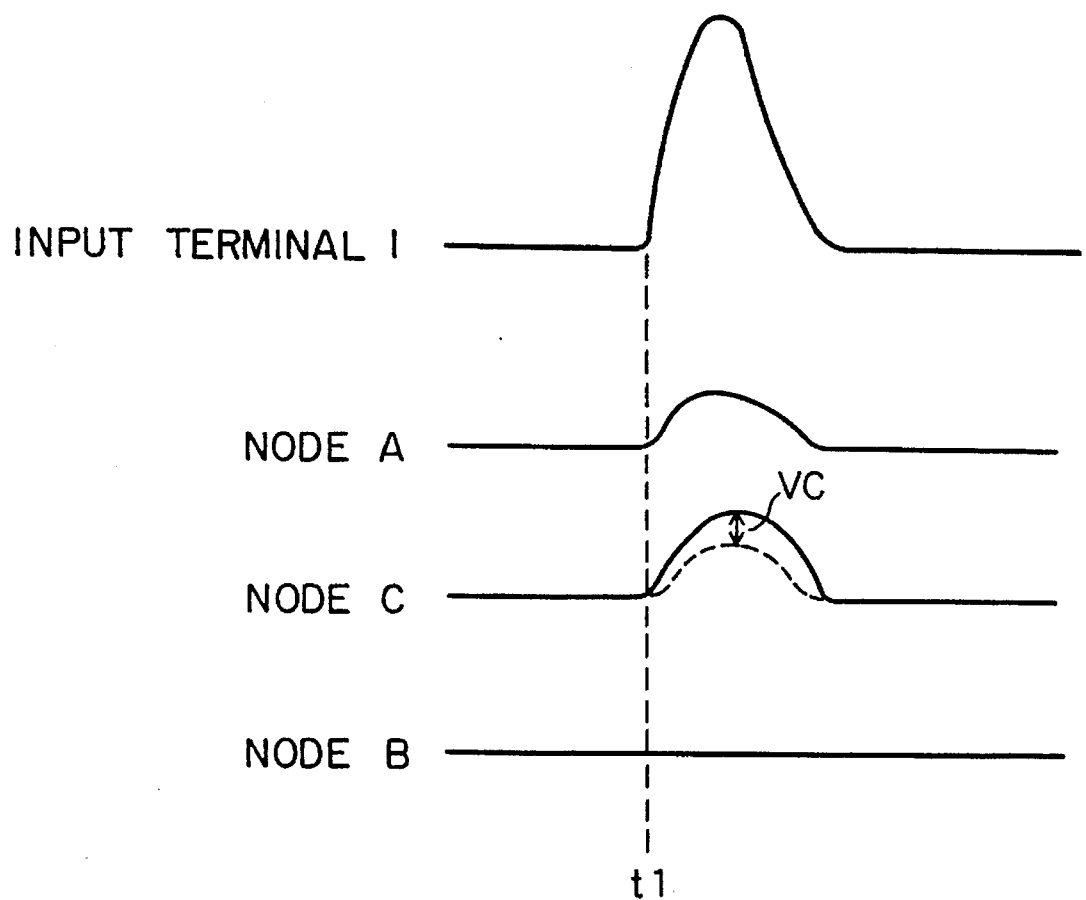
FIG. 3 is a timing chart for the conventional semiconductor devices shown in FIGS. 1 and 2.

FIG. 3 is a timing chart showing the situation as describes above. When the potential at the external input terminal 1 starts to rise at a time instant t1, the potential at node A also rises accordingly by a few tens of volts. The potential at node C constituting an output end of the protective circuit 3 is equal to the sum of the potential at node A and the clamp voltage VC of the protective circuit 3. As a result, node C has a potential equal to the sum of a few tens of volts and the clamp voltage VC with respect to the potential at node B which is substantially maintained at the ground potential.

Accordingly, in the first stage circuit 4, it is likely to happen that the input voltage generates a breakdown field of a gate oxide film while the ground line is maintained at the ground potential as a whole. As a result, the gate oxide films of the CMOS inverter QN1 and QP1 are destroyed.

Figure 2:
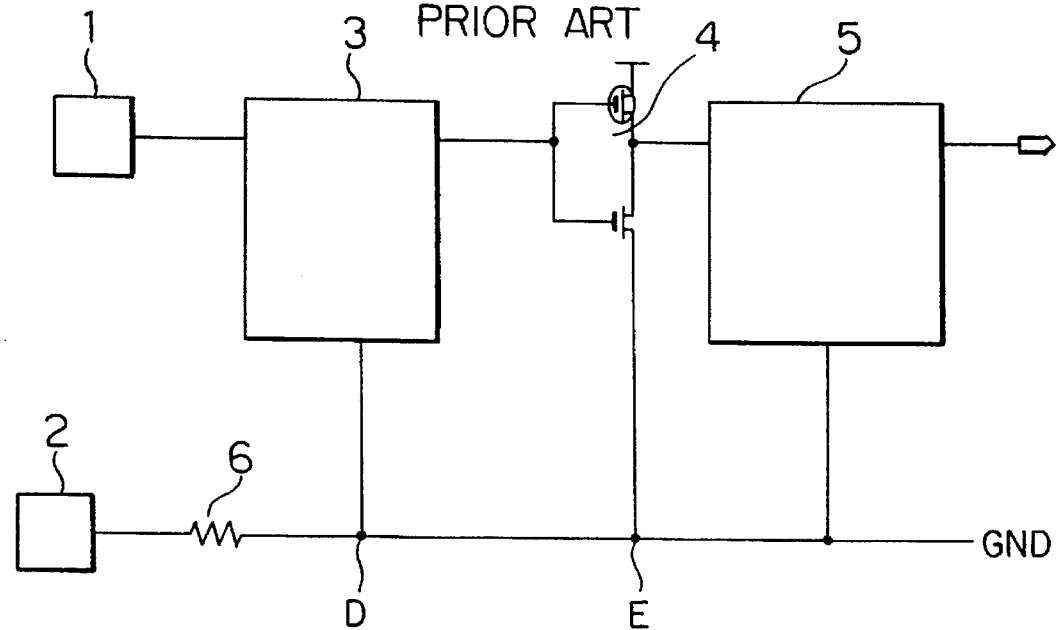
FIG. 2 is a circuit diagram of another conventional semiconductor device.

In the layout shown in FIG. 2 in which a ground line system is implemented by a single ground line GND, the resistance between the node D connecting the the ground line GND with the input protective circuit 3 and the node E connecting the ground line GND with the first stage circuit 4 is smaller than the resistance between nodes A and B of the circuit shown in FIG. 1. Accordingly, destruction in the first stage circuit 4 is less likely to occur. However, there arises another problem in highly integrated VLSIs that a possibility of noise-induced erroneous operations increases in functional circuits thereof.

Now, the present invention will be described with reference to the accompanying drawings.

Figure 4:
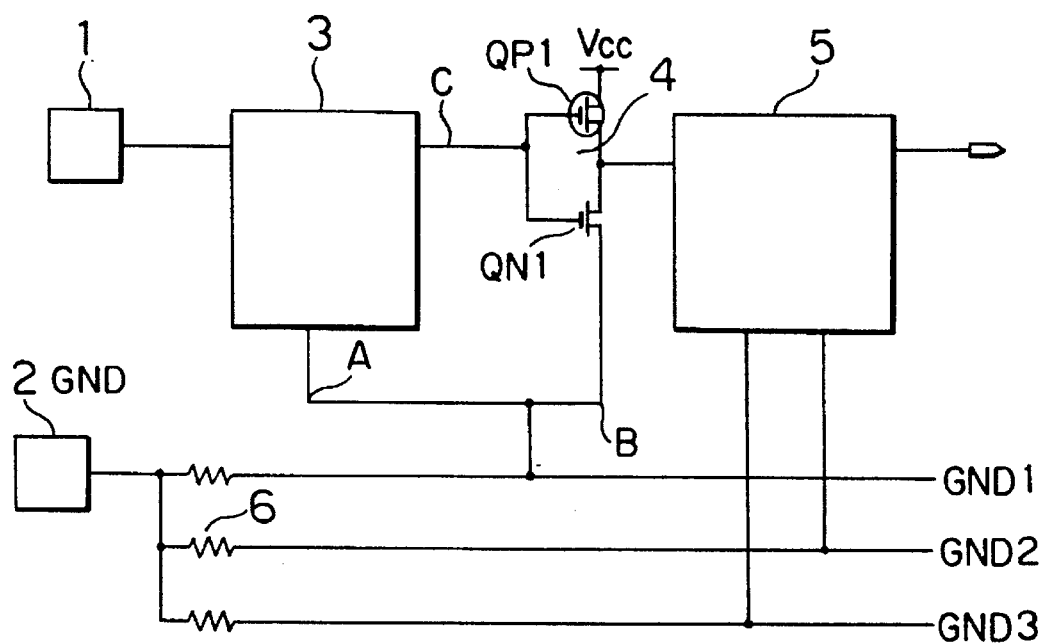
FIG. 4 is a circuit diagram of a semiconductor device according to a first embodiment of the present invention.

FIG. 4 is an equivalent circuit diagram of a semiconductor device according to a first embodiment of the present invention.

In the first embodiment, a ground line system includes a first ground line GND1, a second ground line GND2 and a third ground line GND3, which are connected together at a ground terminal 2 through respective interconnection resistances 6 each shown as connected at the output end of corresponding one of ground lines GND1, GND2 and GND3. Node A for grounding an input protective circuit 3 and node B for grounding a first stage circuit 4 are connected first with each other and then connected to the first ground line GND1 so as to minimize the resistance therebetween.

On the other hand, an internal circuit 5 is connected to the second and third ground lines GND2 and GND3, both of which are formed parallel separately from the first ground line GND1. For example, the third ground line GND3 is provided for output section of the internal circuit 5 for an exclusive use and the second ground line GND2 is provided for other functional circuits.

Figure 5:
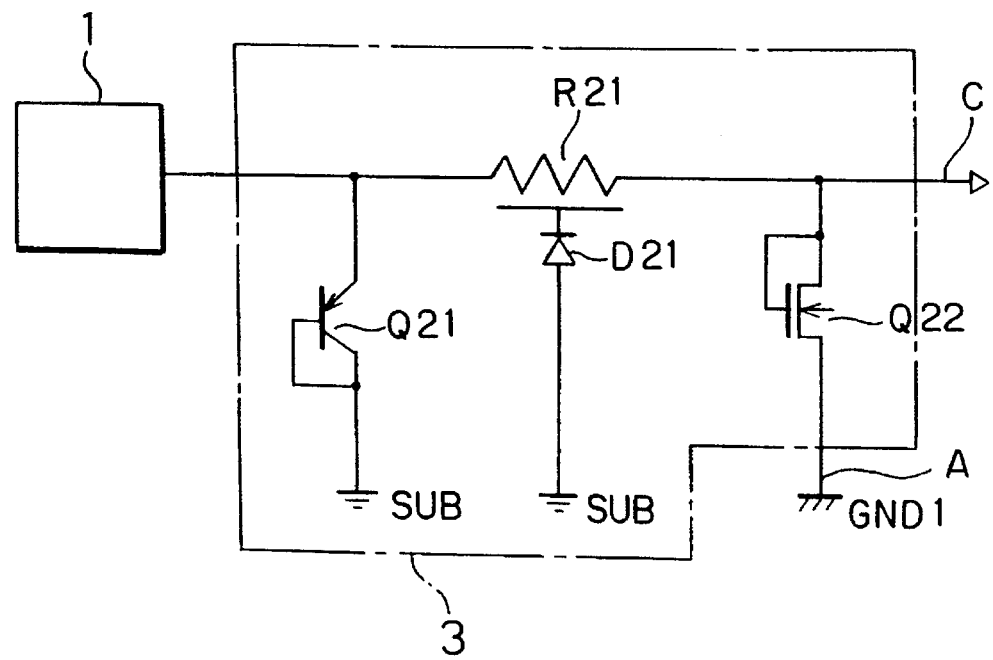
FIG. 5 is a circuit diagram of a protective circuit shown in the semiconductor device of FIG. 4.

FIG. 5 is an equivalent circuit diagram of the protective circuit 3 shown in FIG. 4 which comprises a PNP transistor Q21 responsive to a high voltage applied to an external input terminal 1 to allow a surge current to flow toward a semiconductor substrate SUB, a resistor R21 inserted in series to a signal line, a protective diode D21 for allowing current to flow from the substrate SUB in accordance with the negative potential at the resistor R21 and an NMOSFET Q22 for allowing a surge current to flow further toward the ground line GND1 when the surge voltage passing through the resistor R21 is still high.

Figure 6:
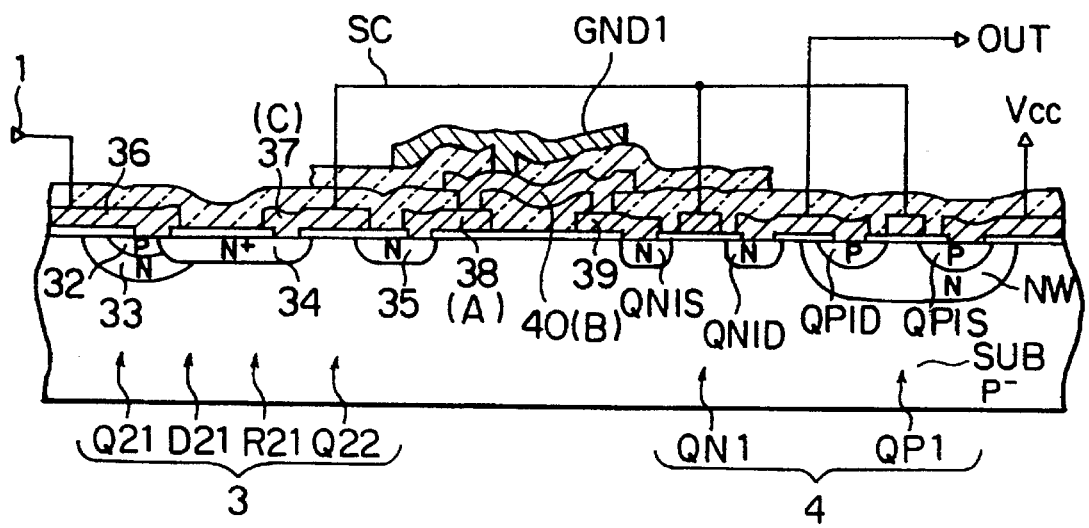
FIG. 6 is a cross-sectional view of the semiconductor device of FIGS. 4 and 5.

FIG. 6 is a cross-sectional view showing an example of the device structure including the protective circuit 3 shown in FIG. 5 formed in a semiconductor substrate. A polysilicon interconnection 36 for propagating an input signal from the external input terminal 1 is directly contacted both with a P-type diffused layer 32 forming the PNP transistor Q21 and with one end of an $N^+$-type diffused layer 34 forming the resistor R21. The $N^+$-type diffused layer 34 also forms the diode D21 between itself and the substrate SUB while constituting a drain of the NMOSFET Q22 at the other end of the $N^+$-type diffused layer 34. The other end of the $N^+$-type diffused layer 34 is connected by a direct contacting technology to a polysilicon interconnection 37, which constitutes both output node C of the protective circuit 3 and a gate electrode of the NMOSFET Q22. An N-type diffused layer 35 constituting a source of the NMOSFET Q22 is connected to another polysilicon interconnection 38. The polysilicon interconnection 38 forms node A for grounding the protective circuit 3.

A PMOSFET QP1 of the first stage circuit 4 is implemented by P-type diffused layers QP1S and QP1D formed in an N-well region NW, which in turn is formed in the substrate SUB as shown in FIG. 6. The diffused layers QP1S and QP1D constitute the source and drain of the PMOSFET QP1, respectively. An NMOSFET QN1 is formed by N-type diffused regions QN1S and QN1D constituting the source and the drain, respectively. The source diffused region QN1S is connected to a polysilicon interconnection 37 forming node B.

The polysilicon interconnections 37 and 38 are further connected to a polysilicon interconnection 40, which is formed as an upper level interconnection layer, through a contact electrode. Accordingly, the polysilicon interconnection 40 allows node A for grounding the protective circuit and node B for grounding the first stage circuit 4 to be short-circuited with each other. Furthermore, the polysilicon interconnection 40 is connected to the first ground line GND1 composed of an aluminum interconnection. The impedance of the polysilicon interconnection 40 is lowered by forming, for example, to be as wide and to be as short as possible to the extent that the layout thereof allows.

Figure 7:
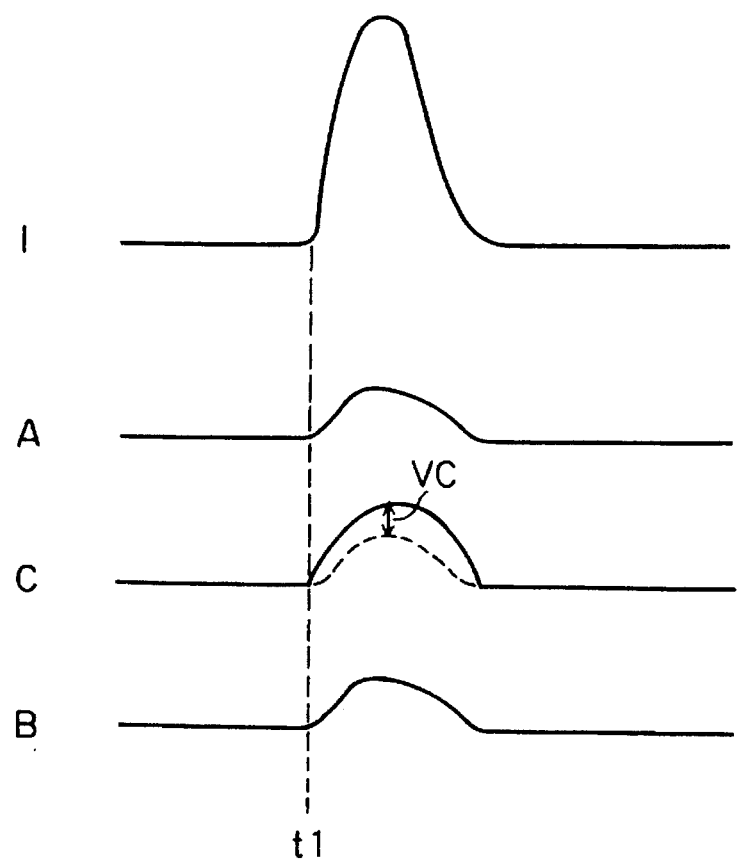
FIG. 7 is a timing chart for the semiconductor device of FIGS. 4 to 6.

FIG. 7 is a timing chart showing an operation of the semiconductor device of the first embodiment in a case where an excessively high voltage is applied to the external input terminal 1. At the time instant t1 when an excessively high voltage enters the input terminal 1, the excessively high voltage is applied both to the P-type diffused layer 32 and to the one end of the $N^+$-type diffused layer 34 through the polysilicon interconnection 36. The excessively high voltage induces a depletion layer at the interface between the N-type diffused layer 33 and the substrate SUB constituting a base-to-collector junction of the PNP transistor 21. When the depletion layer spreads and reaches the P-type diffused layer 32, a surge current flows from the P-type diffused layer 32 to the substrate SUB.

Meanwhile, the $N^+$-type diffused layer 34 functions as the diode D21 to drain a surge current toward the substrate SUB while applying the input voltage to the polysilicon interconnection 37. In this case, the semiconductor substrate SUB is maintained at a predetermined negative potential. As shown in FIG. 6, the polysilicon interconnection 37 functions as the gate electrode of the NMOSFET Q22 to form a channel region thereof in the substrate SUB at a location between the $N^+$-type and N-type diffused layers 34 and 35 constituting the source and drain, respectively. Accordingly, a surge current flows from the $N^+$-type diffused layer 34 through the N-type diffused layer 35 to the polysilicon interconnection 38 formed directly contacted with the layer 35. The polysilicon interconnection 37 itself functions as the signal output node C of the protective circuit 3 shown in FIG. 4 while the polysilicon interconnection 38 constitutes node A of the ground line while being connected to the ground line GND1 through the polysilicon interconnection 40. Hence, current induced by the excessively high voltage input to the external input terminal 1 flows to the ground terminal 2 through the ground line GND1. As a result, the potential at node C is maintained at a potential higher than the potential at node A by the predetermined clamp voltage VC of the protective circuit 3.

In this case, however, the potential at node A is not maintained at the ground potential and rises as shown in FIG. 7 when an excessively high voltage is input because the interconnection resistance 6 exists in the ground line GND1 as shown in FIG. 4. Accordingly, the potential at node C also rises by an amount equal to the sum of the voltage at node A and the clamp voltage VC, and is input to the gates of the MOSFETs QN1 and QP1 constituting the CMOS inverter of the first stage circuit 4 via the signal line SC shown in FIG. 6.

On the other hand, nodes A and B are first connected with each other and then connected to the first ground line GND1, as described before. Accordingly, after the time instant t1, the potential at node B rises to a level lower than the potential at node A by a slight voltage drop induced by the interconnection resistance 6 of the polysilicon interconnection 40. For example, assuming that the clamp voltage VC is 15 V, an excessively high voltage of 2000 V input to the external input terminal 1 induces a potential higher than the potential at node A by 15 volts to the gate of the NMOSFET of the first stage circuit 4, i.e., to node C.

Further assuming that a total grounding resistance from the external input terminal 1 to the GND terminal 2 is 1.5 k$\Omega$, the current passing through node A reaches up to 1.3 A. If a resistance of about 5$\Omega$ exists between node A and GND terminal 2, the voltage difference generated therebetween amounts to about 7 volts. In the first embodiment, the voltage difference between node A and node B is far smaller than 7 volts, so that the potential at node B is substantially equal to 7 volts. In contrast thereto, in the conventional device shown in FIG. 1, the potentials at nodes A and B are 7 volts and 0 volt, respectively. In other words, in this embodiment, the voltage applied between the gates and the sources of the MOSFETs in the first stage circuit 4 is about 15 volts, which is the same value as the clamp voltage, while the voltage will amount to 22 volts in the conventional device, whereby the destruction possibility of the transistor is extremely high compared with the present embodiment. Hence, according to the present embodiment, the first stage circuit 4 is securely protected regardless of a potential rise at the first ground line GND1.

Figure 8:
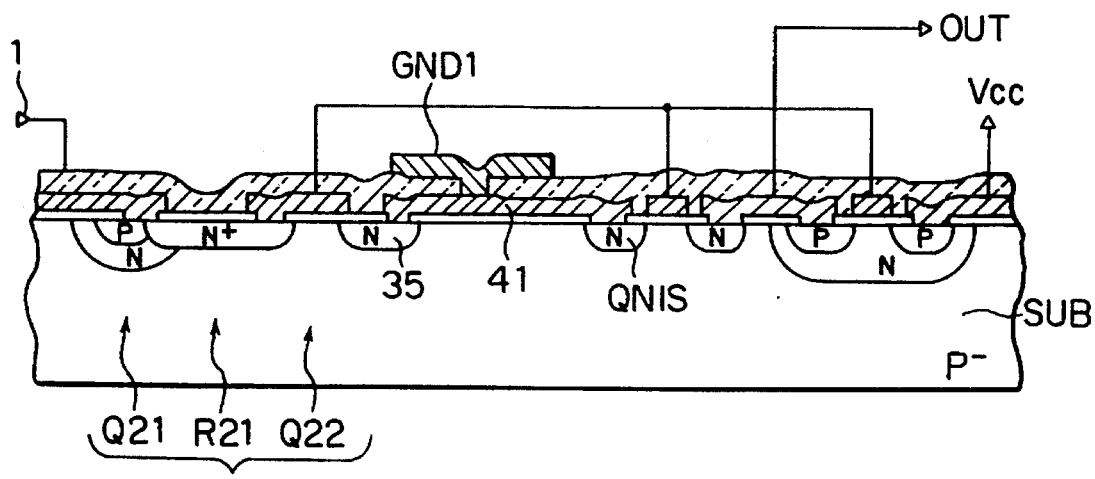
FIG. 8 is a cross-sectional view of a semiconductor device according to a second embodiment of the present invention.

FIG. 8 is a cross-sectional view of a semiconductor device according to a second embodiment which differs from the first embodiment shown in FIG. 6 in that a single polysilicon interconnection 41 is used therein for making a direct contact with each of the N-type diffused layers 35 and QN1S, instead of using a plurality of polysilicon interconnections 38 and 39 in a direct contact with each of the diffused layers 35 and QN1S. With this structure, the potential difference between node A and node B is further decreased, thereby rendering the protecting function more reliable. According to the second embodiment, an interconnection step for forming the polysilicon interconnection 40 can be omitted to facilitate the manufacture of semiconductor devices.

Figure 9:
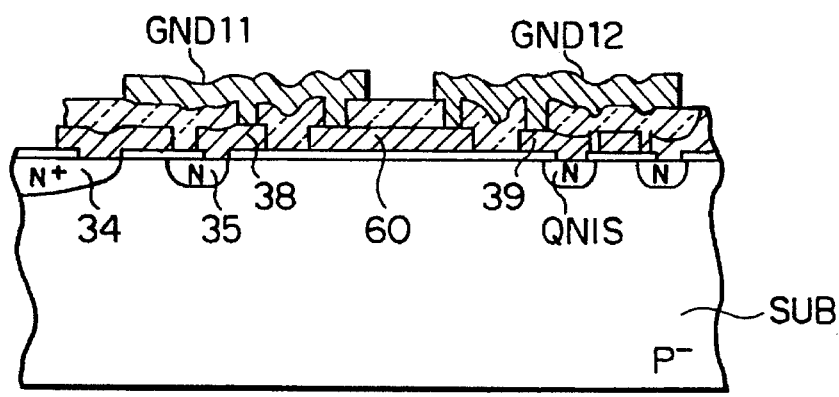
FIG. 9 is a cross-sectional view of a semiconductor device according to a third embodiment of the present invention.
Figure 10:
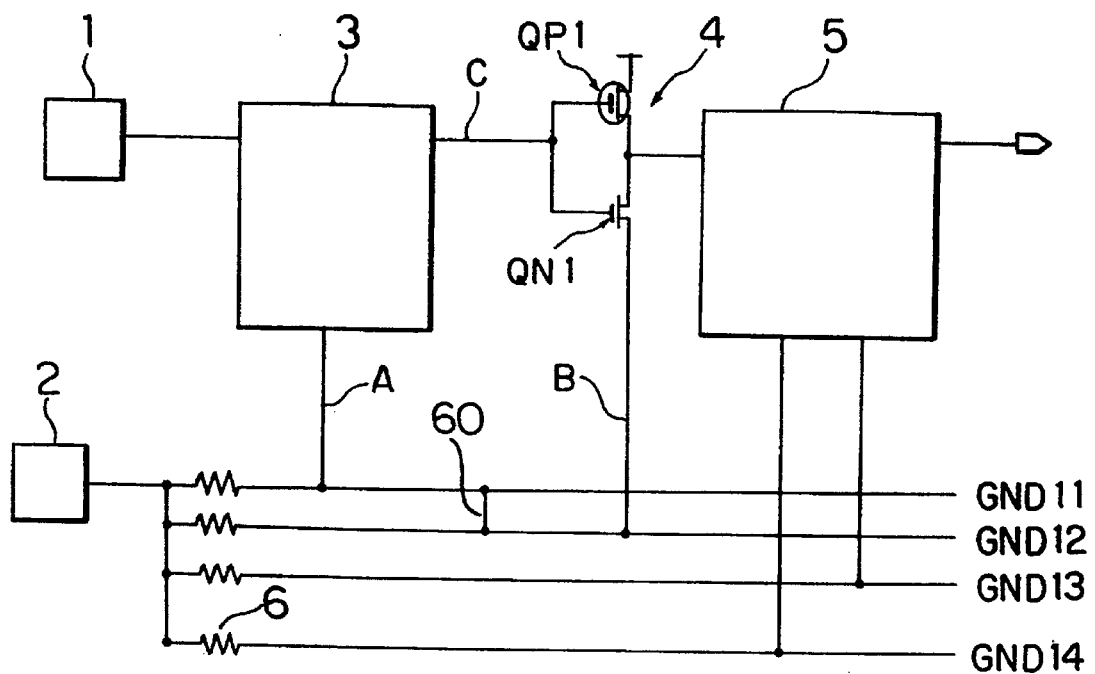
FIG. 10 is a circuit diagram of the semiconductor device illustrated in FIG. 9.

FIGS. 9 and 10 are a cross-sectional view and a circuit diagram, respectively, of a semiconductor device according to a third embodiment of the present invention. In the third embodiment, the protective circuit is grounded by a first ground line GND 11 exclusively used for the protective circuit 3. Among circuits other than the protective circuit 3, the first stage circuit 4 for receiving an output from the protective circuit 3 is provided with and grounded by a second ground line GND12 for an exclusive use therefor. The internal circuits 5 are grounded by a third and fourth ground lines GN13 and GND14. In detail, a polysilicon interconnection 38 forming a node A for grounding the protective circuit 3 is made contacted with the ground line GND 11 while a polysilicon interconnection 39 forming node B for grounding the first stage circuit 4 is made contacted with the second ground line GND 12.

Those first and second ground lines GND11 and GND12 are further connected with each other through the polysilicon interconnection 60. The polysilicon interconnection 60 can be formed in the same level interconnection layer as that of the polysilicon interconnections 38 and 39. The polysilicon interconnection 60 is formed to have a small impedance so as to render the potentials at the ground lines GND 11 and GND 12 roughly equal to each other even when an excessively high voltage is input. This configuration in the third embodiment enables forming an independent ground line specific for each of the input protective circuit 3 and the first stage circuit 4 to thereby prevent the potential difference between node B and node C from being higher than the clamp voltage VC. The configuration does not cause any interconnection-induced complexity or disorder in a layout similarly to the first embodiment while securing the protective function thereof. Moreover, an additional particular step for forming the polysilicon layer 6 such as described before is unnecessary.

Figure 11:
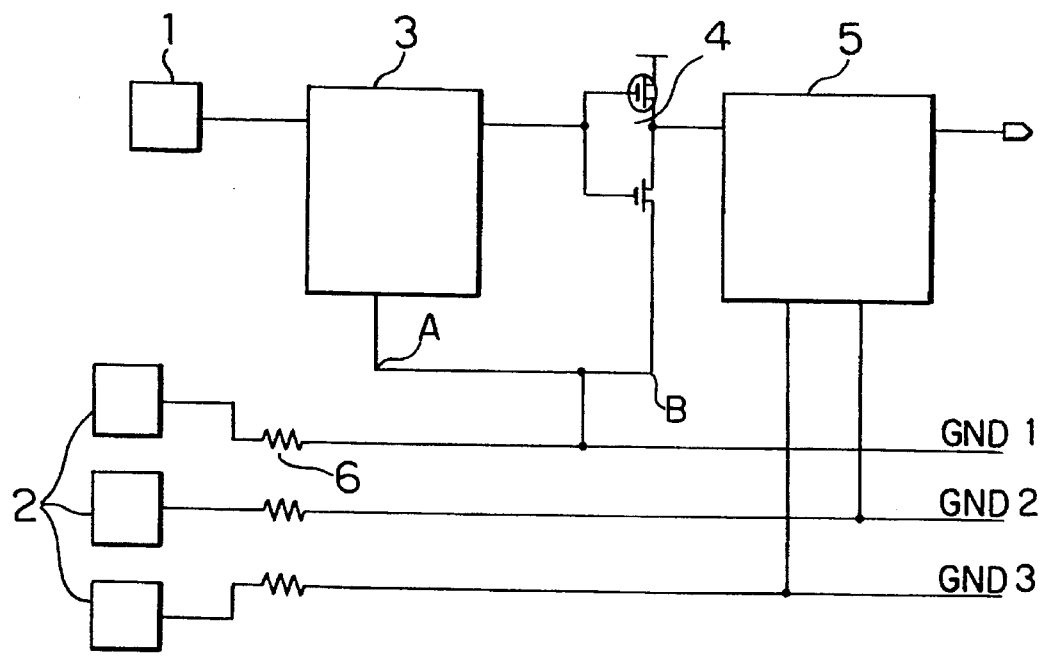
FIG. 11 is a circuit diagram of a semiconductor device according to a fourth embodiment of the present invention.

FIG. 11 shows a ground line system according to a fourth embodiment. To suppress a noise level much more, the ground line system has a structure in which the ground lines are isolated from the beginning, i.e., external ground terminals are provided for the respective ground lines. In the fourth embodiment, node A for grounding the input protective circuit 3 and node B for grounding the first stage circuit 4 are also connected first with each other to minimize a resistance therebetween similarly to the first embodiment. With this structure, the voltage between the gate and the source of the NMOSFET QN1 in the first stage circuit 4 is restricted to a level which does not differ from the clamp voltage VC so much. Accordingly, the possibility in destruction of the transistor is very small.

As described above, the ground line system in the present invention has a plurality of ground lines divided from the circuit purpose point of view. Among those ground lines, a common ground line is employed to clamp an input protective circuit and to ground the first stage circuit of the functional circuit in the semiconductor device. As a result of the configuration, since any difference in potentials is hardly induced between the nodes for grounding the input protective circuit and for grounding the first stage circuit even when a large amount of surge current flows therethrough. Hence, a voltage equal to or greater than the clamp voltage of the input protective circuit is not applied to the first stage circuit, resulting in an advantage that destruction of the internal circuit is avoided.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. A semiconductor device comprising a plurality of ground lines including a first ground line and a second ground line, an input terminal for receiving a first signal from outside said semiconductor device, a first stage circuit, having a first ground node, for receiving said first signal from said input terminal to generate a second signal, a protective device, having a current path including a first end connected to said input form a common ground node, for draining a surge current along terminal and a second end connected to said first ground node to said current path from said input terminal through said common ground node, a first line segment connecting said common ground node to said first ground line, and an internal circuit, having a second ground node connected to said second ground line, for receiving said second signal from said first stage circuit.

2. A semiconductor device as defined in claim 1 further comprising a single ground terminal for said plurality of ground lines and at least one line segment for connecting said plurality of ground lines with each other and to said single ground terminal.

3. A semiconductor device as defined in claim 1 further comprising a plurality of ground terminals each connected to a corresponding one of said plurality of ground lines.

4. A semiconductor device as defined in claim 1 wherein said plurality of ground lines further includes a third ground line and wherein said internal circuit further has a third ground node connected to said third ground line.

5. A semiconductor device as defined in claim 1 wherein said first stage circuit is implemented by a CMOS inverter.

6. A semiconductor device as defined in claim 1 wherein said protective device includes a bipolar transistor and a diode.

7. A semiconductor device comprising a plurality of ground lines including a first ground line and a second ground line, an input terminal for receiving a first signal from outside said semiconductor device, a first stage circuit, having a first ground node connected to said second ground line at a first connecting node, for receiving said first signal from said input terminal to generate a second signal, a protective device, having a current oath including a first end connected to said input terminal and a second end connected to said first ground line at a second connecting node, for draining a surge current along said current path from said input terminal to said first ground line, a first line segment directly connecting said first ground line to said second ground line, said first line segment being arranged adjacent to both said first connecting node and said second connecting node, and an internal circuit for receiving said second signal from said first stage circuit.

8. A semiconductor device as defined in claim 7 further including a single ground terminal for said plurality of ground line and at least one second line segment for connecting said plurality of ground lines to each other and to said single ground terminal.

9. A semiconductor device as defined in claim 8 wherein said plurality of ground lines further includes a third ground line connected to said second ground line, and wherein said internal circuit has a second ground node connected to said third ground line.

* * * * *

UNITED STATES PATENT AND TRADEMARK OFFICE
CERTIFICATE OF CORRECTION

PATENT NO. : 5,521,415
DATED : May 28, 1996
INVENTOR(S) : Yasuo KONDO

It is certified that error appears in the above-indentified patent and that said Letters Patent is hereby corrected as shown below:

Claim 1, column 7, line 21, after "input" insert --terminal and a second end connected to said first ground node to--.

Claim 1, column 7, lines 23-24, delete "terminal and a second end connected to said first ground node to".

Claim 7, column 8, line 16, delete "oath" and insert in place thereof --path--.

Claim 8, column 8, line 28, delete "line" (first occurrence) and insert --lines--.

Signed and Sealed this

First Day of October, 1996

Attest:

BRUCE LEHMAN

Attesting Officer

Commissioner of Patents and Trademarks